United States Patent [19]
Naulleau et al.

[11] Patent Number: 6,100,978
[45] Date of Patent: Aug. 8, 2000

[54] DUAL-DOMAIN POINT DIFFRACTION INTERFEROMETER

[76] Inventors: Patrick P. Naulleau, 5239 Miles Ave., Apt. A, Oakland, Calif. 94618; Kenneth Alan Goldberg, 1195 Keeler Ave., Berkeley, Calif. 94708

[21] Appl. No.: 09/300,539

[22] Filed: Apr. 27, 1999

Related U.S. Application Data

[63] Continuation-in-part of application No. 09/176,617, Oct. 21, 1998.

[51] Int. Cl.$^7$ ......................................................... G01B 9/02
[52] U.S. Cl. ............................................. 356/354; 356/356
[58] Field of Search ..................................... 356/354, 356, 356/360

*Primary Examiner*—Robert H. Kim
*Attorney, Agent, or Firm*—Burns, Doane, Swecker & Mathis, L.L.P.

[57] ABSTRACT

A hybrid spatial/temporal-domain point diffraction interferometer (referred to as the dual-domain PS/PDI) that is capable of suppressing the scattered-reference-light noise that hinders the conventional PS/PDI is provided. The dual-domain PS/PDI combines the separate noise-suppression capabilities of the widely-used phase-shifting and Fourier-transform fringe pattern analysis methods.

The dual-domain PS/PDI relies on both a more restrictive implementation of the image plane PS/PDI mask and a new analysis method to be applied to the interferograms generated and recorded by the modified PS/PDI. The more restrictive PS/PDI mask guarantees the elimination of spatial-frequency crosstalk between the signal and the scattered-light noise arising from scattered-reference-light interfering with the test beam. The new dual-domain analysis method is then used to eliminate scattered-light noise arising from both the scattered-reference-light interfering with the test beam and the scattered-reference-light interfering with the "true" pinhole-diffracted reference light. The dual-domain analysis method has also been demonstrated to provide performance enhancement when using the non-optimized standard PS/PDI design.

The dual-domain PS/PDI is essentially a three-tiered filtering system composed of lowpass spatial-filtering the testbeam electric field using the more restrictive PS/PDI mask, bandpass spatial-filtering the individual interferogram irradiance frames making up the phase-shifting series, and bandpass temporal-filtering the phase-shifting series as a whole.

35 Claims, 6 Drawing Sheets

FIG._8

DUAL-DOMAIN POINT DIFFRACTION INTERFEROMETER

REFERENCE TO RELATED APPLICATION

This application is a continuation in part of U.S. Ser. No. 09/176,617 filed Oct. 21, 1998, still pending.

The U.S. Government has certain rights in this invention pursuant to Contract No. DE-AC03-76SF00098 between the United States Department of Energy and the University of California for the operation of the Lawrence Berkeley National Laboratory.

FIELD OF THE INVENTION

The present invention relates to phase-shifting point diffraction interferometers (PS/PDI) for making highly accurate measurements of wavefront aberrations. The invention overcomes the conventional PS/PDI's susceptibility to noise attributed to scattered light.

References

The following publications are cited in this application as superscript numbers:

1. D. M. Williamson, "The elusive diffraction limit", OSA Proceedings on Extreme Ultraviolet Lithography, Optical Society of America, Washington, D.C., 23, 68–76 (1994).
2. W. Linnik, "A simple interferometer to test optical systems," Proceedings of the Academy of Science of the USSR, 1, 210–212 (1933).
3. R. N. Smartt and W. H. Steel, "Theory and application of point-diffraction interferometers," Jap. J. Appl. Phys., 14, Suppl. 14-1, 351-356 (1975).
4. G. E, Sommargren, "Phase shifting diffraction interferometry for measuring extreme ultraviolet optics," OSA Trends in Optics and Photonics Vol. 4, Extreme Ultraviolet Lithography, G. D. Kubiak and D. R. Kania, eds. (Optical Society of America, Washington, DC 1996), pp. 108–112.
5. G. E. Sommargren, "Diffraction methods raise interferometer accuracy," Laser Focus World, 32, 61–71, (August 1996).
6. J. E. Bjorkholm, et al, "Phase-measuring interferometry using extreme ultraviolet radiation," J. Vac. Sci. Technol. B, 13, 2919–2922 (1995).
7. A. K. Ray-Chaudhuri, et al, "Alignment of a multilayer-coated imaging system using extreme ultraviolet Foucault and Ronchi interferometric testing," J. Vac Sci Technol. B, 13, 3089–3093 (1995).
8. H. Medecki, et al, "Phase-shifting point diffraction interferometer," Opt. Lett., 21, 1526–1528 (1996).
9. P. Naulleau et al, "Characterization of the accuracy of EUV phase-shifting point diffraction interferometry," in Emerging Lithographic Technologies II, Yuli Vladimirski, Editor, Proceedings of SPIE Vol. 3331, 114–123, (1998).
10. E. Tejnil, et al, "At-wavelength interferometry for EUV lithography," J. Vac. Sci. Technol. B, 15, 2455–2461 (1997).
11. K. A. Goldberg, et al, "Characterization of an EUV Schwarzschild objective using phase-shifting point diffraction interferometry," in Emerging Lithographic Technologies, David E. Seeger, Editor, Proceedings of SPIE Vol. 3048, 264–270 (1997).
12. P. Carre, "Installation et utilisation du comparateur photoelectric et interferential du bureau international des poids et mesures," Metrologia, 2, 13–17 (1966).
13. R. Crane, "Interference phase measurement," Appl. Opt., 8, 538–542 (1969).
14. J. H. Bruning, et al, "Digital wavefront measuring interferometer for testing optical surfaces and lenses," Appl. Opt., 13, 2693–2703 (1974).
15. M. Takeda, et al, "Fourier-transform method of fringe-pattern analysis for computer-based topography and interferometry," J. Opt. Soc. Am., 72, 156–160 (1982).
16. E. Leith, et al, "Electronic holography and speckle methods for imaging through tissue using femtosecond gated pulses," Appl. Opt., 30, 4204–4210 (1991).
17. K. A. Goldberg, et al, "A 3-D numerical study of pinhole diffraction to predict the accuracy of EUV point diffraction interferometry," OSA Trends in Optics and Photonics Vol. 4, Extreme Ultraviolet Lithography, G. D. Kubiac and D. R. Kania, eds, (Optical Society of America, Washington, DC 1996), pp. 133–137.
18. D. A. Tichenor, et al, "Development and characterization of a 10× Schwarzschild system for SXPL," in OSA Proceedings on Soft X-Ray Projection Lithography, Vol. 18, A. M. Hawryluk and R. H. Stulen, eds., (Optical Society of America, Washington, DC, 1993), pp. 79–82.
19. R. Beguiristain, et al, "High flux undulator beam line optics for EUV interferometry and photoemission microscopy," in High Heat Flux Engineering III, A M Khounsary, Editor, Proceedings of SPIE Vol. 2855, 159–169 (1996).
20. D. Attwood, et al, "Undulator radiation for at-wavelength interferometry of optics for extreme-ultraviolet lithography," Appl. Opt., 32, 7022–7031 (1993).
21. H. Medecki, U.S. Pat. No. 5,835,217 issued Nov. 10, 1998.
22. P. de Groot, "Derivation of algorithms for phase-shifting interferometry using the concept of a data-sampling window," Appl. Opt., 34, 4723–4730 (1995).
23. K. Freischlad and C. Koliopoulos, "Fourier description of digital phase-measuring interferometry," J. Opt. Soc. Am. A, 7, 542–551 (1990).
24. Y. Surrel, "Design algorithms for phase measurements by the use of phase stepping," Appl. Opt., 35, 51–60 (1996).
25. J. Tome and H. Stahl, "Phase-measuring interferometry: applications and techniques," in Optical Testing and Metrology II, Proceedings of SPIE Vol. 954, 71–77 (1988).
26. K. Creath, "Comparison of phase-measuring algorithms" in Surface Characterization and Testing, Proceedings of SPIE Vol. 680, 19–28 (1986).
27. H. Stahl, "Review of phase-measuring interferometry," in Optical Testing and Metrology III: Recent Advances in Industrial Optical Inspection, Proceedings of SPIE Vol. 1332, 71–77 (1990).

All of the above publications are herein incorporated by reference in their entirety to the same extent as if each individual publication was specifically and individually indicated to be incorporated by reference in its entirety.

BACKGROUND OF THE INVENTION

The emergence of extreme ultraviolet (EUV) projection lithography has placed stringent demands on interferometric metrology systems. In order to achieve diffraction-limited performance, EUV lithographic systems require wavefront tolerances on the order of 0.02 waves rms (0.3 nm rms at a wavelength of 13.4 nm).[1] While the accuracy of interferometry is typically limited by the quality of the reference surface or wave, a class of interferometers has been developed in which extremely high quality reference waves are created by diffraction from small apertures.[2–5]

EUV lithographic systems rely on wavelength-specific reflective multilayer coatings. To accurately probe phase effects in these resonant reflective structures, at-wavelength metrology is required. Various at-wavelength interferometric measurement techniques including lateral-shearing interferometry,[6] Foucault and Ronchi testing[7] have been reported. These methods, however, have yet to demonstrate the accuracy required for the development of EUV lithographic imaging systems. In order to meet the accuracy challenge, an EUV-compatible diffraction-class interferometer, the phase-shifting point diffraction interferometer (PS/PDI), was developed by Medecki et al.[8,21]

Figure 1A:
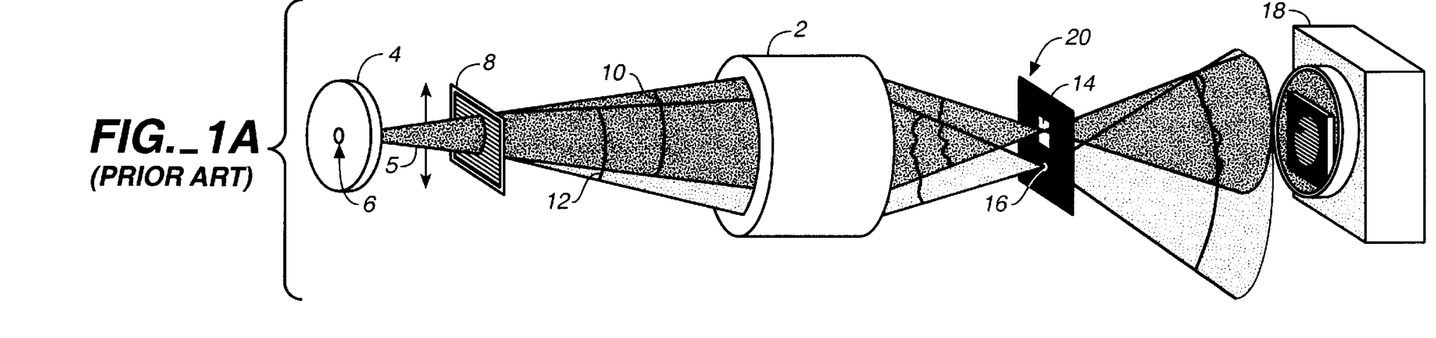
FIG. 1A is a schematic of the phase-shifting point diffraction interferometer (PS/PDI)
Figure 1B:
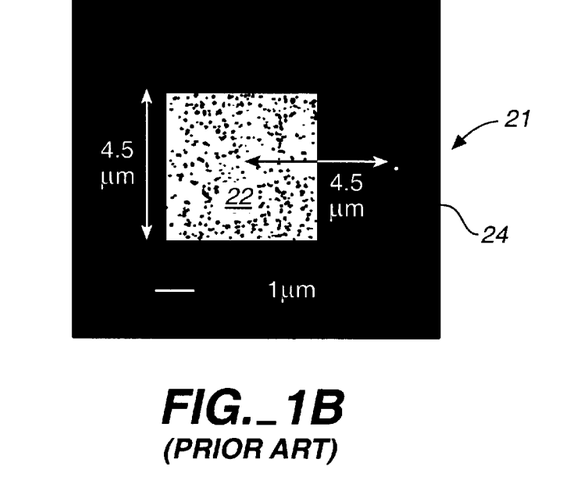
FIG. 1B illustrates an non-optimized (standard configuration) PS/PDI mask.

The PS/PDI is a variation of the conventional point diffraction interferometer in which a transmission grating has been added to greatly improve the optical throughput of the system and add phase-shifting capability. In the PS/PDI, as illustrated in FIG. 1A, the optical system 2 under test is illuminated by a spherical wave 5 that is generated by an entrance pinhole 6 in a mask 4 that is placed in the object plane of the optical system 2. To assure the quality of the spherical-wave illumination, pinhole 6 is chosen to be several times smaller than the resolution limit of the optical system. Grating 8 splits the illuminating beam 5 to create the required test and reference beams 10 and 12, respectively. A PS/PDI mask 20 is placed in the image plane of the optical system 2 to block the unwanted diffracted orders generated by the grating 8 and to spatially filter the reference beam 12 using a reference pinhole 16. The test beam 10, which contains the aberrations imparted by the optical system, is largely undisturbed by the image-plane mask by virtue of it passing through window 14 in the PS/PDI mask 20 that is large relative to the point-spread function (PSF) of the optical system under test. The test and reference beams propagate to the mixing plane where they overlap to create an interference pattern recorded on a CCD detector 18. The recorded interferogram yields information on the deviation of the test beam from the nominally spherical reference beam. FIG. 1B depicts a PS/PDI mask 21 comprising a square shaped window 22 and a reference pinhole 24 to the right which has a diameter of less than 100 nm[8, 10, 11, 21].

The original PS/PDI[8] requires the image-plane beam separation to be sufficient to prevent the reference beam from passing through the test-beam window. For a given separation, this requirement places limits on the scattering and aberrations that can be present in the optic under test. If these limits are not met, the accuracy of the PS/PDI is compromised. It is not feasible to simply increase the image-point separation to strictly meet the above separation requirements due to the unreasonable fringe density this would produce.

The reference wavefront in the PS/PDI has been shown to have a systematic-error-limited accuracy[9] of 0.05 nm, and the PS/PDI has been successfully used in testing prototype EUV lithographic systems.[10,11] One of the drawbacks of the PS/PDI, however, is its susceptibility to scatter or high-frequency features that can cause confusion of the test and the scattered-reference beams. In the presence of this scattered light, the reference beam is no longer a clean spherical wave, but includes high-frequency features that make the interferometry more difficult. Mid-spatial-frequency features in the wavefront of interest are especially susceptible to this problem.

SUMMARY OF THE INVENTION

The present invention is directed to a hybrid spatial/temporal-domain point diffraction interferometer that is capable of suppressing the scattered-reference-light noise that hinders the conventional PS/PDI.

In general, phase-shifting interferometers[12–14] do not require the use of a spatial carrier. This is due to the fact that the phase-encoding modulation occurs in the temporal domain; therefore, a spatial carrier is not required to unambiguously recover the phase information from the interferograms. From the point of view of accuracy and resolution, it is often desirable to operate without a spatial carrier. However, by design, the PS/PDI forces a spatial carrier to be present. Nonetheless, the PS/PDI configuration is preferable over the conventional point diffraction configuration[2,3] due to its ease of phase shifting and greatly increased optical throughput.[8] Although the presence of the spatial carrier in the PS/PDI makes it possible to perform the data analysis in the spatial domain using static-fringe-analysis methods (such as the Fourier method[15]), the interferometer is not optimized for this type of analysis. Typically, the time-domain-analysis method is used due to the fact that it is impervious to spatial variations in the illumination or detector sensitivity.

In the present invention, an alternative configuration in physical implementation and data analysis, referred to as the dual-domain point diffraction interferometer, in which the PS/PDI spatial carrier becomes an asset is employed. The invention uses an improved PS/PDI mask design, and applies a new analysis method to the interferograms generated by the improved PS/PDI. The invention combines the separate noise-suppression capabilities of the widely-used phase-shifting and Fourier-transform fringe-pattern-analysis methods. The improved PS/PDI mask design guarantees the elimination of spatial-frequency crosstalk between the signal and the scattered-light noise arising from scattered-reference light interfering with the test beam. The new dual-domain analysis method is then used to eliminate scattered-light noise arising from both the scattered-reference light interfering with the test beam and the scattered-reference light interfering with the "true" pinhole-diffracted reference light. The dual-domain analysis method has also been demonstrated to provide performance enhancement when using the nonoptimized standard PS/PDI design.

In one aspect the invention is essentially a three-tiered filtering system composed of (1) lowpass spatial-filtering the test-beam electric field using the improved PS/PDI mask, (2) bandpass spatial-filtering the individual interferogram irradiance frames making up the phase-shifting series, and (3) bandpass temporal-filtering the phase-shifting series as a whole.

In one embodiment, the invention is directed to a method of generating an interference pattern with a point diffraction interferometer that includes the steps of:

(a) directing a source of radiation toward a test optic provided in a test optic region of the point diffraction interferometer, the test optic having an image plane located downstream from the test optic;

(b) dividing the source radiation into at least a reference beam and a test beam directed at different angles with respect to one another such that the reference beam impinges at a first location on the image plane and the test beam impinges at a second location, laterally separated from the first location, on the image plane;

(c) phase-shifting at least one of the reference beam and the test beam;

(d) passing the reference beam through a reference pinhole on a mask that is positioned at the image plane of the test optic to produce a reference wave; and passing the test beam through a test-beam window on the mask to produce a test wave;

(e) recording a set of interference patterns (interferograms), with relative phase shifts between each element of the set, wherein the interferograms are produced by combining the reference wave and the test wave and phase shifting either the test wave or reference wave; and (f) recovering a test-beam wavefront by processing the recorded interferograms in both the temporal and spatial domains.

In another embodiment, step (f) includes (i) bandpass spatial-filtering individual interferograms irradiance frames comprising a phase-shifting series, and (ii) using time-domain-based techniques to recovering the test-beam wavefront from the resulting filtered phase-shifting series.

In a further embodiment, step (f) includes (i) using time-domain-based techniques to recover the complex amplitude of the test beam from the phase-shifting series, and (ii) bandpass spatial-filtering the resulting complex amplitude to generate the test-beam wavefront.

In yet another embodiment, step (f) comprises embedding a bandpass spatial-filtering process into a time-domain algorithm, thereby, simultaneously processing the data in both the temporal and spatial domains.

In a preferred embodiment, the separation between the center of the test-beam window and the center of the reference pinhole is sufficiently large relative to the full width of the test-beam window to achieve full separation of the first and zero order components of the recorded interfere spatial-frequency domain.

DETAILED DESCRIPTION OF THE PREFERRED EMBODIMENTS

The Fourier Fringe-Analysis Method (Spatial-Frequency Domain)

In the past, PS/PDI data analysis had primarily been performed using a time-domain phase-shifting method.[5,7,8] Owing to the PS/PDI spatial carrier, however, it is also possible to perform the analysis using static-fringe (spatial-domain) methods such as the Fourier-transform method.[15] The application of the Fourier analysis method to PS/PDI data is considered in this section. A more detailed description of the Fourier-transform method can be found in the literature.[15] For the sake of brevity, the following analysis is performed in one dimension, considering only the dimension in the direction parallel to the image-plane beam separation; extension of the analysis to the second lateral dimension is straightforward. The fundamental concepts are identical for, and easily extended to, two dimensions; hence, all the equations subsequently presented could readily be represented in two-dimensional space. Because the method presented here is primarily a filtering process, the analysis is performed in the frequency domain.

First, the spatial-spectrum of the signal in the detector (recording) plane due to the reference-beam light alone is considered. The reference beam at the detector is a summation of the reference-beam light diffracted by (transmitted through) the reference pinhole and the reference-beam light scattered through the test-beam window and can be written as, $$U_r(f_x) = A\delta(f_x - f_c) + \text{rect}\left(\frac{f_x}{W}\right) n(f_x), \quad (1)$$

where $n(f_x)$ is a complex-valued noise function representing the reference-beam light scattered through the test-beam window represented as rect(●), $f_x$ is a variable representing spatial frequency, A is the reference-beam amplitude at the reference pinhole (the pinhole is approximated by δ(●), the Dirac delta function), $f_c$ is the separation between the pinhole and the center of the test-beam window in the spatial-frequency domain, and W is the width of the test-beam window in the spatial-frequency domain. The reference-beam light scattered through the test-beam window (the second term in Eq. (1)) leads to the corruption that needs to be eliminated from the measurement. Owing to the fact that in the PS/PDI there exists a Fourier-transform relationship between the signals in the image and detector planes, Eq. (1) is equivalent to the real-space reference-beam signal in the image plane, where $f_x \geq x/(\lambda z)$ with z being the distance between the image and detector planes. For example, an image-plane beam separation of 4.5 µm in a typical EUV implementation, where λ=13.4 nm, and z=130 mm, corresponds to $f_c$=0.0026 lines/µm. Similarly, a window width of 3 µm would correspond to W=0.0017 lines/µm.

As was done with the reference beam, the spatial-spectrum of the test-beam contribution in the detector plane can be expressed as $$U_t(f_x) = \text{rect}\left(\frac{f_x}{W}\right) S(f_x), \quad (2)$$

where $S(f_x)$ is the test beam (PSF of the optic under test) including the scattered light in the test beam. The contribution of the test beam to the light passing through the reference pinhole has been ignored owing to its extremely small amplitude. Combining the test- and reference-beam terms in the detector plane yields $$U(f_x) = A\delta(f_x - f_c) + \text{rect}\left(\frac{f_x}{W}\right)[n(f_x) + S(f_x)]. \quad (3)$$

Figure 2A:
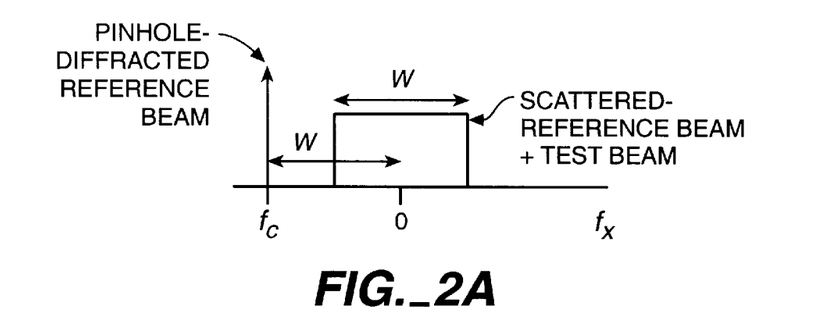
FIGS. 2(a) and 2(b) are the spatial spectra of the field in the recording plane and the recorded irradiance, respectively, for the standard PS/PDI mask case.

This signal is graphically depicted in FIG. 2(a), where the spatial-spectrum shape of the light propagating through the test-beam window ($S(f_x)$) has been ignored.

The signal has been depicted assuming the conventional PS/PDI configuration, where $f_c$ was arbitralily chosen to be equal to the full-width of the test-beam window. In this configuration, the criterion for choosing $f_c$ and the window width is that the beam separation be much greater than the width of the optical system PSF. This criterion comes from the desire that an insignificant amount of reference-beam light passes through the test-beam window. When notable scatter or high-frequency defects are present in the optic under test and the PSF becomes broad, this criterion is difficult to meet due to the large image-plane separation, hence high fringe-density, it would require. Failure to adequately separate the beams is what leads to the scatter susceptibility problem of the PS/PDI. Also, appropriate beam separation may be difficult to achieve in the case where large aberrations lead to a PSF that is much larger than the diffraction limited PSF.

Figure 2B:
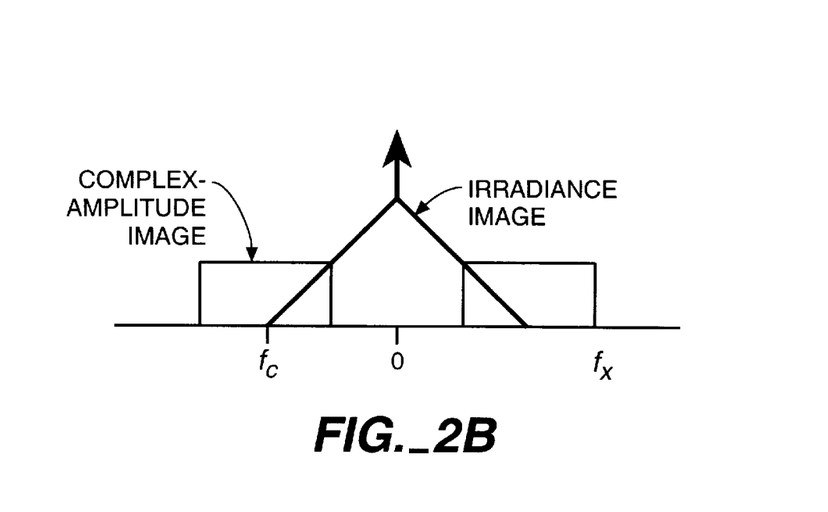

The interferogram that is recorded by the detector is the irradiance, or equivalently the modulus squared of the inverse Fourier transform of $U(f_x)$ (Eq. (3)). By way of the Autocorrelation Theorem, it is evident that the spatial-spectrum of the recorded signal is the autocorrelation of $U(f_x)$ as depicted in FIG. 2(b). The central triangular peak is the zero-order term; this is essentially the irradiance of the light passing through the test-beam window. The two off-axis components are the positive- and negative-first order terms that arise from the interference between the pinhole-diffracted reference beam and the light passing through the test-beam window. Either one of these first-order components can be used to recover the complex amplitude of the light passing through the test-beam window, assuming they are separable from the zero order.

For the purposes of Fourier-domain analysis, there is clearly a problem with the configuration in FIGS. 2(a) and (b): the first orders are not completely separated from the zero order in the spatial-frequency domain. It is also important to note that in this configuration, high-frequency noise terms from the zero order map to low-frequency terms in the signal because the overlap reaches to the center of the signal passband. For this reason, the current PS/PDI configuration is not particularly well-suited for Fourier-domain analysis, which, strictly speaking, requires full separation of the orders. This aspect is well understood in the realm of electronic holography.[16]

Figure 3A:
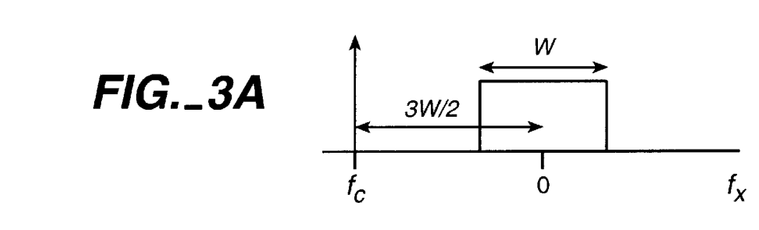
FIGS. 3(a) and 3(b) are the spatial spectra of the field in the recording plane and the recorded irradiance, respectively, for the spatial-analysis-optimized PS/PDI mask case.
Figure 3B:
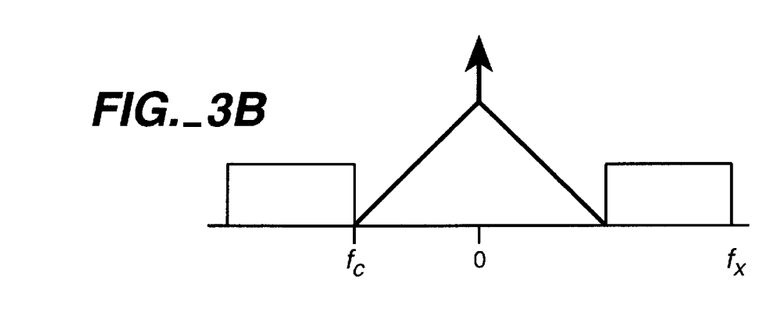

As described above, the depictions in FIGS. 2(a) and (b) are based on the simplifying assumption of the test beam having a flat spectrum. This assumption leads to significant energy in the wings of the zero order. In practice the test-beam window is chosen to be many times larger than the full-width at half-maximum (FWHM) of the test beam, leading to zero-order wings that are much smaller than those depicted in FIGS. 2(a) and (b). If, however, high accuracy is the goal, then fill separation over the spatial-frequency band of interest should be guaranteed. This separation can be achieved by increasing the carrier frequency (or equivalently the beam separation) from W to at least 3W/2. Doing so will increase the fringe density by a factor of 1.5, therefore, more detector resolution may be required. Typically, this has not been a limiting factor. Another consequence of the increased beam separation is an increase in the hyperbolic-fringe distortion present in spherical-reference systems. This effect is linear with separation and can be predicted, measured, and removed.[9] An alternative to increasing the beam separation is to appropriately reduce the test-beam window size. This would have the effect of reducing the bandwidth of the measurement by a factor of 1.5. In this scenario, there is a tradeoff between measurement bandwidth and scattered-light-noise suppression. Again, typically this is not a limiting factor. The spatial-analysis-optimized configuration, where the beam separation has been increased to 3W/2, is depicted in FIGS. 3(a) and (b).

The above analysis is valid in the lateral direction parallel to the image-plane beam separation. The restrictions on the window size do not apply to the direction orthogonal to the beam separation because there is no concern of overlapping orders in this direction.

Because the scattered-reference light interfering with the test beam is confined to the zero-order term of the interferogram, this noise term can be isolated from the signal by ensuring that the zero order does not overlap with the first orders. This is accomplished by using a properly configured mask as described above. The Fourier-domain analysis method can then be used to selectively extract the signal free of zero-order corruption using a Fourier-domain digital filter. Having done so, the noise term due to the scattered-reference light interfering with the test beam is eliminated. However, from the presence of $n(f_x)$ in Eq. (3) it is apparent that this is not the entirety of the scattered-reference-light noise. Therefore, the Fourier-domain method alone cannot suppress all scattered-light noise.

Dual-Domain Analysis Method

In this section it is further demonstrated that the Fourier-transform (spatial-domain) analysis method alone cannot fully eliminate the scattered-reference-light noise. Moreover, the assertion made above that the temporal-domain analysis method applied to phase-shifting data also suffers from scattered-reference-light noise is established. Finally, the hybrid spatial/temporal processing technique (the dual-domain method) capable of completely eliminating the scattered-reference-light corruption problem is described in detail.

In order to facilitate the following discussion, the various interference components are defined as follows according to their spatial-frequency content while distinguishing the signal of interest from noise terms.

1. Signal, $\text{rect}\left(\frac{f_x - f_c}{W}\right) S(f_x - f_c)$:

the pinhole-diffracted reference beam interfering with the test beam propagating through the test-beam window.

2. Baseband-noise $rect\left(\frac{f_x}{W}\right)n(f_x) \otimes rect\left(\frac{f_x}{W}\right)S(f_x)$;

where $\otimes$ represents the cross-correlation operator: This is the reference beam scattered through the test-beam window interfering with the test beam. The spatial spectrum of this noise term is limited to the autocorrelation width of the test-beam window and is centered at zero spatial frequency, hence it is referred to as baseband-noise.

3. Passband-noise $rect\left(\frac{f_x - f_c}{W}\right)n(f_x - f_c)$:

reference beam scattered through the test-beam window interfering with the pinhole-diffracted reference beam. The spatial spectrum of this noise term is confined to the same spatial-frequency region as the signal, hence it is called passband-noise.

In order to gain better understanding of the scattered-reference-light corruption problem for the spatial- and temporal-domain-analysis methods respectively, the recorded interferogram is considered in more detail. The method presented here relies on the frequency-domain separability of the signal and noise terms, therefore it is best to express the recorded interferogram in the frequency domain as opposed to the more conventional $a(x)+b(x)\cos[2\pi f_c + c(x)]$ spatial form. This approach is routinely used in the realm of Fourier optics and more specifically holography. From this point of view, the recorded interferogram is seen in terms of interferometric orders, where the modulated light makes up the positive- and negative-first orders and the unmodulated light makes up the zero order.

The spatial-frequency-domain (Fourier) analysis from the previous section is first considered in more detail. The spectrum of the recorded interferogram consists of the autocorrelation of Eq. (3) and can be written in the form $\{\delta(f_x)+\Gamma[a(f_x)]\}+a(f_x+f_c)+a^*(f_x-f_c)$, where $\Gamma[a(f)]$ is defined as the autocorrelation of $a(f)$. These three terms are the zero order and the positive- and negative-first order, respectively as depicted earlier in FIGS. 2(b) and 3(b). Performing this operation on Eq. (3), the interferometric orders of interest are found to be:

$$\text{first order} = rect\left(\frac{f_x - f_c}{W}\right)[n(f_x - f_c) + S(f_x - f_c)] \quad (4a)$$

$$\text{zero order} = \delta(f_x) + \Gamma\left\{rect\left(\frac{f_x}{W}\right)[n(f_x) + S(f_x)]\right\} \quad (4b)$$

Relative amplitudes have been ignored because they are irrelevant to this presentation. The Fourier-domain analysis consists simply of extracting the first order using a bandpass filter in the spatial-frequency domain and performing the inverse Fourier transform.[15] In this case, even if the spatial-order-separation problem discussed above is corrected by setting $f_c$ to $3W/2$ instead of W, there is the corruption problem caused by the appearance of both the signal and passband-noise in the first spatial-order of the interferogram.

Next it is shown that temporal-domain analysis of phase-shifting interferometric data is also susceptible to the deleterious effects of beam overlap in the image plane. To perform temporal-domain analysis, a series of interferograms with varying phase-shifts between the test and reference beams is required. Demodulation is then performed on a pixel-by-pixel basis by examining the evolution of the intensity at each pixel throughout the temporal series of interferograms. Because temporal-domain analysis of phase-shifting data is essentially a temporal-filtering process and it is the frequency-domain separability of the signal and noise terms that is of interest, it is useful to express the signal in both temporal-frequency and spatial-frequency domains. To this end Eq. (3) is rewritten to include temporal frequency, $\nu$.

$$U(f_x, \nu) = A\delta(f_x - f_c, \nu - \nu_c) + rect\left(\frac{f_x}{W}\right)[n(f_x)\delta(\nu - \nu_c) + S(f_x)\delta(\nu)]. \quad (5)$$

Equation (5) is the spectrum of the electric field in the detector plane in both the spatial and temporal domains, where without loss of generality it is assumed that the phase-shifting occurs on the reference beam alone and $\nu_c$ is the temporal carrier frequency set by the number of phase-shifting cycles contained in the phase-shifting series.

To see the effect of the temporal-filtering process, the recorded interferogram time series is expressed as interferometric orders in the temporal domain. The spectrum of the recorded interferograms consists of the autocorrelation of Eq. (5) and can be separated into interferometric temporal-orders as, $$\text{first order} = \left[rect\left(\frac{f_x - f_c}{W}\right)S(f_x - f_c) + \quad (6a)\right.$$

$$\left. rect\left(\frac{f_x}{W}\right)n(f_x) \otimes rect\left(\frac{f_x}{W}\right)S(f_x)\right]\delta(\nu - \nu_c)$$

$$\text{zero order} = \left\{\Gamma\left[rect\left(\frac{f_x}{W}\right)n(f_x)\right] + \quad (6b)\right.$$

$$\left. \Gamma\left[rect\left(\frac{f_x}{W}\right)S(f_x)\right] + rect\left(\frac{f_x - f_c}{W}\right)n(f_x - f_c) + \delta(f_x)\right\}\delta(\nu)$$

This is analogous to the representation in Eq. (4), where now the first order contains the time-varying (phase-shifting modulated) intensity and the zero order contains the static (dc or unmodulated) component. The first temporal-order is used to determine the phase at each pixel. Equation (6a) shows that both the signal and baseband-noise contribute to the reconstructed wavefront. The presence of the baseband-noise in Eq. (6a) is the PS/PDI scatter problem mentioned above. The passband-noise, however, appears only in the zero temporal-order and thus does not contribute to the wavefront reconstructed by the temporal-domain-analysis method.

Although neither the Fourier-transform-analysis (static-fringe) nor the temporal-domain-analysis methods alone can fully eliminate the scattered-reference-light noise, it is important to note that as the reference pinhole gets smaller, making the reference beam weaker, the temporal-domain-analysis method becomes more vulnerable to the scattered-light noise, whereas the static-fringe-analysis method does not. This is because the energy contained in both the signal and the passband-noise diminish proportionally as the pinhole-diffracted reference light diminishes; thus, the scattered-light-induced signal-to-noise ratio (SNR) in the static-fringe-analysis method, which suffers from passband-noise corruption, is independent of pinhole size. On the other hand, the baseband-noise energy is independent of the energy in the pinhole-diffracted reference beam; thus, the scattered-light-induced SNR in the temporal-domain-analysis case drops as the pinhole-diffracted reference light diminishes (the pinhole gets smaller). This is problematic because the fundamental accuracy (reference-wave limited accuracy) of the PS/PDI improves as the reference pinhole gets smaller,[9,17] but at the same time, the temporal-domain-analysis method becomes more vulnerable to scattered-reference-light noise. Turning to the spatial-domain method alone is not the optimal solution because it lacks many of the beneficial attributes of the phase-shifting method and, as shown above, it is not completely free of scattered-reference-light noise.

Here it is shown that it is possible to perform the analysis in such a way that the phase-shifting benefits are maintained while suppressing all scattered-reference-light noise. Examination of Eqs. (4) and (6) shows that combining the two analysis methods can entirely eliminate scattered-reference-light noise, assuming complete spatial-order separation is guaranteed. This is due to the fact that the only term to appear in the first order of both domains (Eqs. (4a) and (6a)) is $$rect_x\left(\frac{f_x - f_c}{W}\right) S(f_x - f_c),$$

the isolated signal term.

Recovering the signal free of both baseband-noise and passband-noise is now straightforward. Digitally applying a spatial domain zero-order-blocking filter to each recorded element of the temporal (phase-shifting) series will eliminate the baseband-noise. This can alternatively be implemented as bandpass filters centered on the first orders of each recorded interferogram. When the spatial carrier is properly chosen there is a natural zero (imposed by the physical test-beam window in the PS/PDI mask) in the spatial spectrum at the ends of the zero order; therefore, imposing a digital filter after recording of the interferogram is no more restrictive than the physical window itself and no spatial-frequency content is sacrificed. At this point, the process has generated series of filtered interferograms in which the baseband-noise has been suppressed. This is simply a bandpass spatial-filtering process, no phase recovery has yet occurred. The cleaned interferograms can be represented as a set in the spatial/temporal frequency domain as $$\iota(f_x, v) = rect\left(\frac{f_x - f_c}{W}\right)[n(f_x - f_c)\delta(v) + S(f_x - f_c)\delta(v - v_c)] + \quad (7)$$
$$rect\left(\frac{f_x + f_c}{W}\right)[n^*(f_x + f_c)\delta(v) + S^*(f_x + f_c)\delta(v - v_c)],$$

Alternatively, the recorded signal can be rewritten as a function of time at some arbitrary spatial location $x_0$ as $$I(t) = N(x_0) + |s(x_0)|\cos[2\pi v_c t + \angle s(x_0)], \quad (8)$$

where $N(x)$ is the inverse Fourier transform of $n(f_x)$, $s(x)$ is the inverse Fourier transform of $S(f_x)$, and $\angle s(x)$ is the phase of $s(x)$.

Although at this point the baseband-noise term is suppressed, the spatially modulated noise term (passband-noise) remains. Because the remaining passband-noise is separable from the signal in the temporal-frequency domain as is evidenced by Eqs. (7) and (8), the signal free of any scattered-reference-light noise can be recovered by performing the usual temporal-domain analysis on the phase-shifting data. In the dual-domain analysis case the scattered-reference-noise suppression properties of both individual methods are simultaneously realized. In addition, the benefits of the phase-shifting method are realized.[12–14]

It has previously been stated that the PS/PDI is not well-suited to testing systems with relatively large aberrations.[8] This statement came from the requirement of having adequate separation of the PSFs in the image plane in order to prevent the reference beam from passing through the test-beam window. Noting that large aberrations that cause reference light to pass through the test-beam window are fundamentally no different than scatter causing reference light to pass through the window, it is evident that the dual-domain implementation, with properly configured mask, extends the usefulness of the PS/PDI to larger aberrations. Although the dual-domain technique is still limited by the measurement bandwidth constraints imposed by the test-beam window, spurious interference terms limiting the accuracy of the measurement are suppressed.

Flexibility of the Dual-Domain Analysis Method

Though full elimination of the scattered-reference-light problem using the dual-domain analysis method requires the improved PS/PDI mask design described above, this analysis method is also useful in the less restrictive cases such as the conventional PS/PDI mask case where the window width is equal to the beam separation. Here, the zero-order-blocking (spatial) filter must be reduced in size relative to the full width of the zero order because the zero order extends to the center of the spatial passband of interest. Alternatively, a bandpass filter can be positioned centered on the positive- and negative-first orders (spatial) of the interferogram. Equivalently, because the interferogram is a real signal, twice the real part of the single-sideband-filtered image can be used (this bandpass-filtering point of view is equally relevant to the improved mask case described above). The trade-off between baseband-noise elimination and resolution in the reconstructed wavefront becomes evident. What is lost in this case is some efficiency in baseband-noise suppression. In practice, however, this loss of efficiency may be negligible. The spectral width of the baseband-noise is determined by the cross-correlation of the test-beam spectrum with the scattered-reference-light spectrum. The scattered-reference-light spectrum is limited by the width of the test-beam window and, in many practical situations, the test-beam spectrum is well approximated by a narrow peak (less than one-tenth of the width of the test-beam window) along with low-level wings extending to the edges of the test-beam window. This situation leads to the concentration of baseband-noise energy in an area that is not much larger than the test-beam-window width.

Figure 4A:
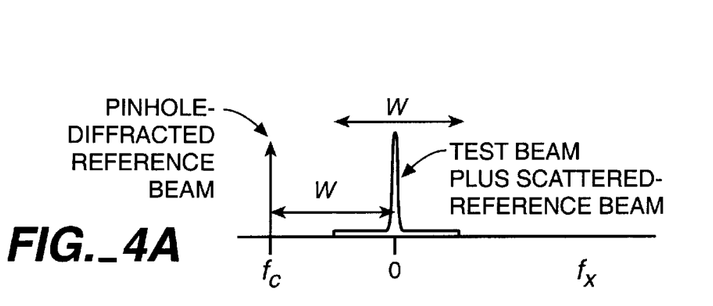
FIG. 4(a) is the spectrum of the field at the recording plane with standard PS/PDI mask, assuming a more realistic test-beam distribution then shown in FIGS. 2 and 3.
Figure 4B:
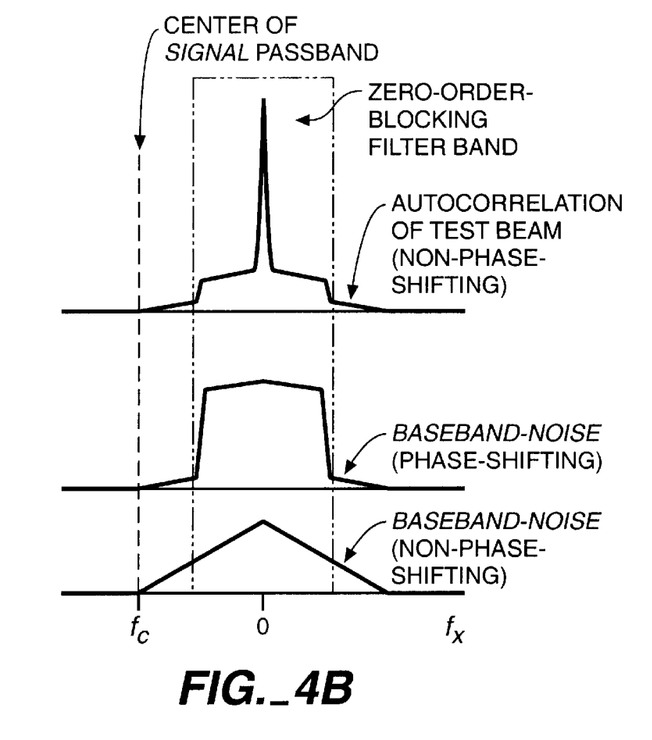
FIG. 4(b) is the on-axis components of the detected irradiance spectrum of FIG. 4(a). The y-axis scale is greatly exaggerated to accentuate features of interest. Also the scaling is different for each component.

FIGS. 4(a) and 4(b) shows the standard-mask configuration (as in FIGS. 2(a) and (b)) with a more realistic representation of the signal spectrum. FIG. 4(a) depicts the spectrum of the field at the detector plane. The test beam is now comprised of a narrow central lobe and low-level scatter. Also contributing to the halo around test-beam central lobe is the scattered-reference light. FIG. 4(b) depicts the on-axis components of the detected irradiance spectrum. The y-scaling is modified between components to make the features of interest visible. The first component is the autocorrelation of the test beam; this is the second element from the temporal zero order in Eq. (6). This component is non-phase-shifting, therefore, the fact that it spills into the signal passband is irrelevant to the dual-domain analysis. The second component in FIG. 4(b) is the cross-correlation of the test beam and the scattered reference light; this component is the second element from the temporal first order in Eq. (6) and is both phase-shifting and spills into the signal passband. Although the dual-domain-analysis method cannot completely suppress this term in the standard-mask configuration, it is evident that a significant portion of it can be eliminated. Finally, the third component in FIG. 4(b) is the autocorrelation of the scattered reference light; this is the first element from the temporal zero order in Eq. (6). This component is non-phase-shifting and poses no problem to the dual-domain analysis.

The above demonstrates that in practice the dual-domain method can be effective even without the use of a dual-domain optimized PS/PDI mask. When applied to the less restrictive PS/PDI mask configuration, this method is capable of eliminating all scattered-reference-light noise except the phase-shifting baseband-noise appearing in the signal passband. In this configuration, the effectiveness of the dual-domain-analysis method improves with the ratio of the test-beam central lobe to halo magnitude. In addition, the optimal zero-order-blocking filter width is approximately the width of the test-beam window plus twice the width of the test-beam central lobe.

Considering a hypothetical case where the main-lobe to halo intensity ratio is $10^6$, the FWHM of the point-spread function is 200 nm, and the beam separation and test-beam-window width are 4.5 $\mu$m, the non-optimized dual-domain method can eliminate over 99% of the phase-shifting baseband-noise. The fact that the zero-order-blocking filter extends into the signal passband has the effect of reducing the effective test-beam-window size (the size of the numerical spatial filter applied in the processing). For this example, the effective test-beam-window size is only reduced by about 0.3 $\mu$m to 4.2 $\mu$m.

Practical implementation

In the PS/PDI, the optical system 12 (FIG. 1C) under test is illuminated by a spherical wave 15 that is generated by an entrance pinhole 16 in a mask 14 that is placed in the object plane of the optical system 12. Radiation 19 is from radiation source 17. Grating 18 splits the illuminating beam 15 to create the required test and reference beams 110 and 112, respectively. A PS/PDI mask 120 is placed in the image plane of the optical system 12 to block the unwanted diffracted orders generated by the grating 18 and to spatially filter the reference beam 112 using a reference pinhole 116. The test beam 110 is largely undisturbed as it passes through a window 114 in the PS/PDI mask 120 that is large relative to the PSF of the optical system under test. The test and reference beams propagate to the mixing plane where they overlap to create an interference pattern recorded on a charged-coupled device detector (CCD) 118.

Figure 1C:
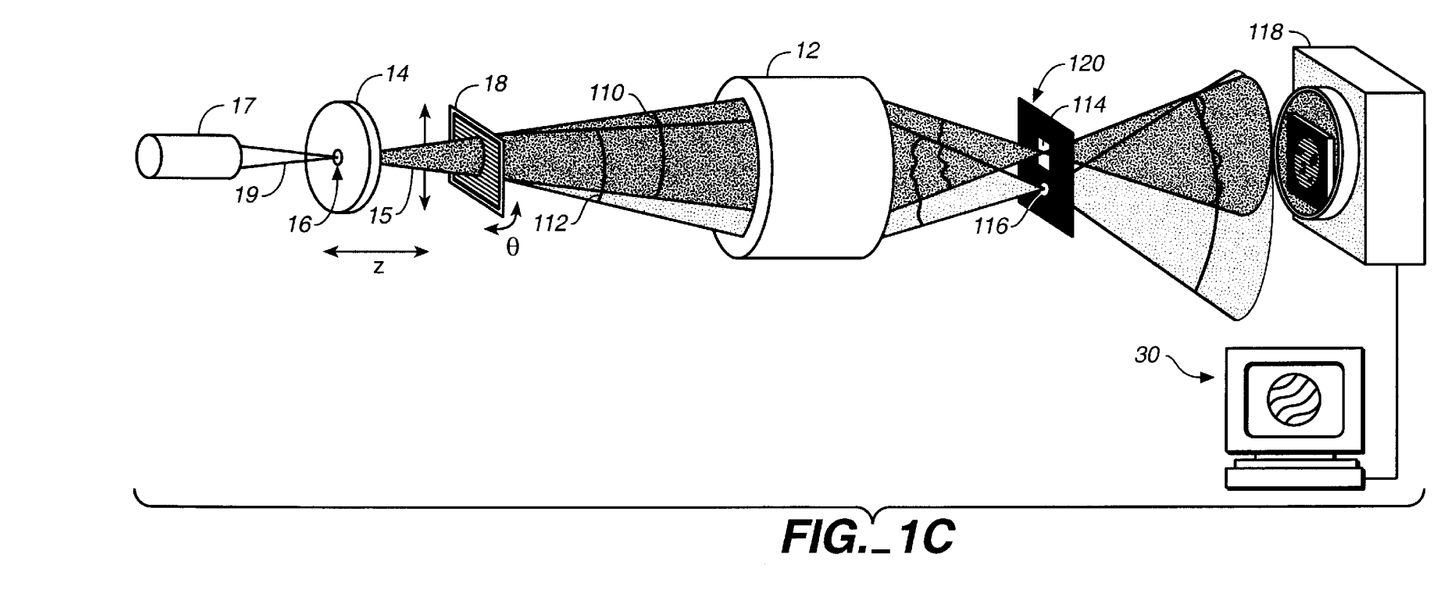
FIG. 1C is a schematic of the PS/PDI of the present invention.

Converting the standard PS/PDI to the optimized dual-domain PS/PDI requires the conventional PS/PDI mask 120 to be replaced by a dual-domain-optimized PS/PDI mask. This optimized mask must meet the criterion described above: namely, the reference pinhole to window-center separation must be at least 1.5 times the window width in the direction of the pinhole separation. In the dual-domain PS/PDI, the interferometric data is collected in the same way as with the conventional PS/PDI. This data collection entails collecting a series (at least three and preferably more) of interferograms where the relative phase between the reference and test beams is shifted between each element of the series. For the PS/PDI described here, phase shifting is accomplished by lateral translation of the grating beam splitter 18 as shown in FIG. 1C.

The other component required in converting the standard PS/PDI to the dual-domain PS/PDI is the modified analysis procedure described above. The PS/PDI is preferably implemented with a computer system 30 which controls the CCD camera and contains software for recording and analyzing the phase-shifting series of interferograms. The modified analysis procedure may be any computer algorithm that effectively implements the dual temporal and spatial processing methods described above allowing full elimination of the scattered-light noise. Temporal processing refers to processing the temporally evolving data on a pixel-by-pixel basis. In this case the CCD camera can be viewed as a set of independent, parallel detectors. The data to be processed is the series of irradiance values recorded for each particular pixel over time. Spatial processing, on the other hand, refers to processing each interferogram frame separately. In this case, what is important is how the irradiance evolves as a function of pixel location (or space).

In one embodiment of the dual-domain PS/PDI analysis, the software first bandpass spatial filters the individual interferogram irradiance frames comprising the phase-shifting series and then determines the phase at each pixel using the temporal evolution of the irradiance. The spatial filtering is most conveniently implemented by Fourier transforming, multiplying by a Fourier-domain-filter function, and inverse Fourier transforming. The Fourier-domain-filter-function size should be set equal to the test-beam window size (as defined in the spatial-frequency domain) and should be centered on the positive- and/or negative-first orders of the interferogram. This filtering method is closely related to Fourier-transform fringe analysis.[15] Alternatively, the spatial filtering could be implemented using a convolution process where the convolution kernel is the Fourier transform of the Fourier-domain filter described above. To determine the phase at each pixel, one of various conventional time-domain algorithms could be used. These techniques are widely described in the literature[22–27] and are widely used in commercial interferometers from manufactures such as Zygo, Middlefield, Conn. and Veeco, Plainview, N.Y.

In another embodiment of the dual-domain PS/PDI analysis, the software first performs conventional time-domain-based analysis to recover the complex amplitude of the test beam from the phase-shifting series. It then performs bandpass spatial-filtering of the resulting complex amplitude to recover the wavefront. In yet another embodiment, the software embeds the bandpass spatial-filtering process into a conventional time-domain algorithm thereby simultaneously processing the data in the two domains. In this case, the spatial-filtering process is performed from within the time-domain algorithm and is used to filter intermediate data produced by the algorithm.

Figure 8:
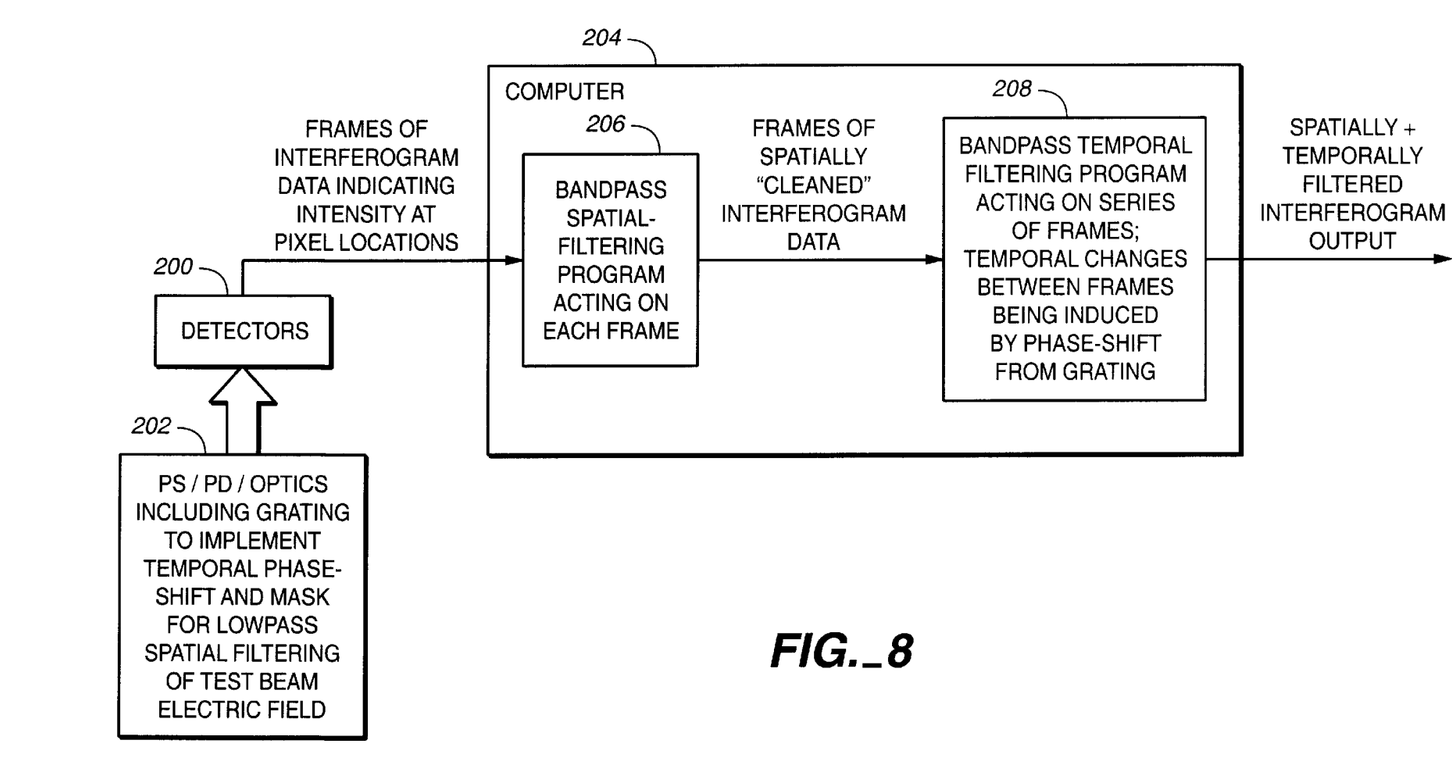
FIG. 8 is a diagram that illustrates operation of one embodiment.

FIG. 8 is a diagram that illustrates the operation of one embodiment of the dual-domain PS/PDI data collection and processing system. A detector 200 detects an interferogram produced by the optic under test 202. The interferogram changes over time as a result of the phase-shifting caused by lateral translation of the grating. The detector 200 produces an output that is sent to a computer 204. The output consists of a number of frames (at least 3) of data produced at different times. Each frame has an intensity value for each pixel of the detector.

A spatial-filtering program 206 residing in the computer 204 spatially filters each recorded frame separately as described above. The spatial-filtering program 206 produces frames of spatially "cleaned" data; the scattered-light noise arising from the scattered-reference-light interfering with the test beam has been eliminated.

A program implementing a phase-shifting-interferometry algorithm (temporal-domain processing) 208 uses the series of "cleaned" frames to produce the wavefront output. This step simultaneously acts as a temporal filtering step, removing the scattered-light noise arising from the scattered-reference light interfering with the "true" pinhole-diffracted reference light.

The method described here can be viewed as combining two previously used methods in a prescribed manner, achieving better results than possible with either method alone.

As further described herein, in a preferred embodiment the separation between the center of the test-beam window and the center of the reference pinhole is sufficiently large relative to the full width of the test-beam window to achieve full separation of the first- and zero-order components of the recorded interferograms in the spatial-frequency domain. In particular, the separation between the center of the test-beam window and the center of the reference pinhole is preferably at least about 1.5 times the lateral width of the test-beam window. Typically, the test-beam window is a rectangular-shaped opening with a width of between 1 μm and 100 μm and a length of between 1 μm and 400 μm, and the separation between the center of the test-beam window and the center of the reference pinhole is between 1.5 μm and 150 μm. Preferably, the reference pinhole has a diameter of about 5 nm to 2000 nm.

Experimental results

The concepts presented here have been verified by performing interferometric wavefront measurements on a prototype EUV 10×-demagnification Schwarzschild lithographic system.[18] The Schwarzschild optic used in these tests has an rms wavefront error of about 2 nm. The interferometry was performed using an undulator beamline[19] which provides a tunable source of essentially coherent EUV radiation.[20] The tests were performed at a wavelength near 13 nm, matching the designed operational wavelength of the test optic.

Figure 5A:
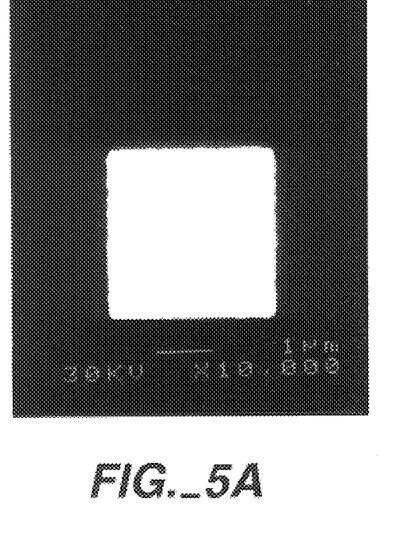
FIG. 5(a) is a scanning electron micrograph of the dual-domain-analysis optimized mask with a window size of 3 µm and pinhole to window-center separation of 4.5 µm.
Figure 5B:
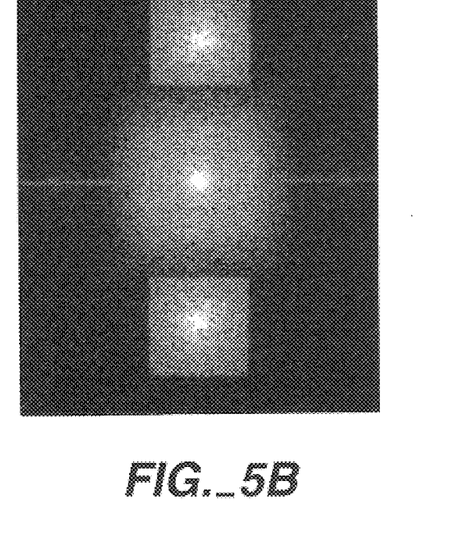
FIG. 5(b) is the log-scale image of the magnitude of the Fourier transform of the recorded intensity pattern when using the optimized mask.

FIG. 5(a) shows a scanning electron micrograph of the dual-domain-analysis optimized mask with a window size of 3 μm and pinhole to window-center separation of 4.5 μm. FIG. 5(b) shows a log-scale image of the magnitude of the Fourier transform of the recorded intensity pattern when using the optimized mask. The desired spatial-frequency-domain separation between the first orders and the zero order is evident. These masks are open stencil and are fabricated using electron-beam lithography.

Figure 6A:
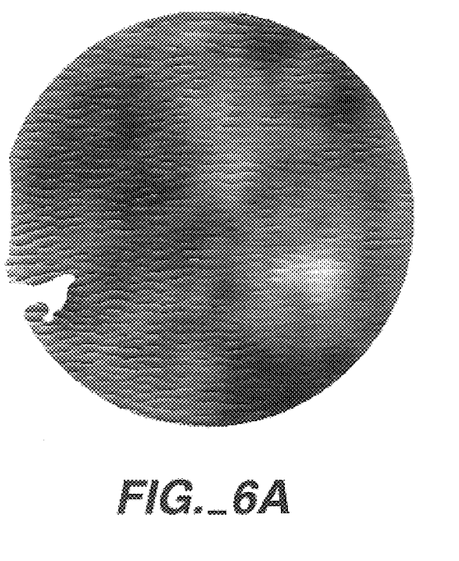
FIGS. 6(a) and 6(b) show the wavefronts obtained using standard temporal-processing (phase-shifting) and dual-domain methods, respectively. The same source data and an optimized PS/PDI mask were used in both cases.
Figure 6B:
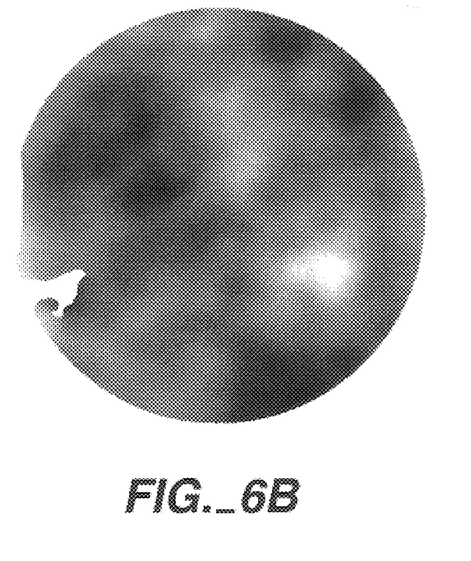

FIG. 6 demonstrates the effectiveness of the dual-domain processing technique. The reference pinhole size in this case is 100 nm. Pinholes of this size have previously been shown[9] to provide a reference wave accuracy of $\lambda_{EUV}/250$ (0.054 nm) within a numerical aperture of 0.08. For the test optic considered here, using a reference pinhole this small is troublesome for the standard PS/PDI because the reference light scattered through the window is of comparable magnitude to the pinhole-diffracted reference light. We note that the specific pinhole size at which this problem with the standard PS/PDI becomes evident depends on the resolution and scatter characteristics of the particular optic being tested. FIG. 6(a) shows the wavefront obtained using standard temporal-processing (phase-shifting) techniques. The blanked-out regions of the wavefront are areas where the test optic reflectance was too low to accurately measure the phase. The high-frequency features can be attributed to the baseband-noise that is not suppressed by conventional temporal-domain analysis. These features cause serious phase retrieval errors. FIG. 6(b) shows the results for the same data set analyzed using the dual-domain method. The baseband-noise has been effectively eliminated. The rms wavefront error for the dual-domain processing results is 2.13 nm (0.16 waves), whereas the wavefront error is 2.72 nm (0.20 waves) using the conventional temporal-domain method. The rms magnitude of the difference wavefront between FIGS. 6(a) and 6(b) is 1.68 nm (0.13 waves).

Figure 7A:
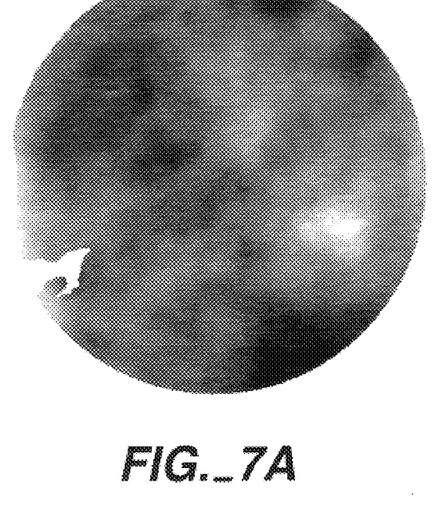
FIG. 7(a) shows the wavefront obtained using a standard PS/PDI mask and conventional time-domain analysis with a 200-nm reference pinhole.
Figure 7B:
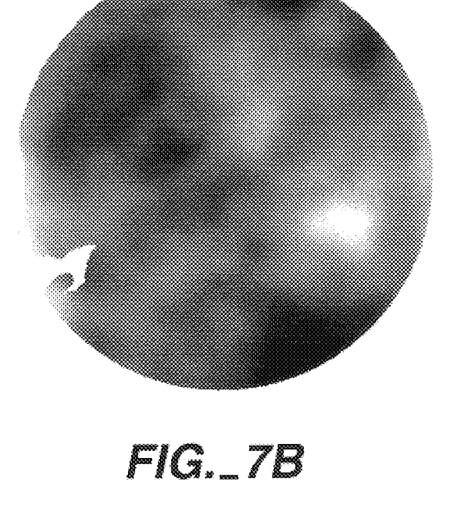
FIG. 7(b) shows the wavefront obtained using a standard PS/PDI mask and dual-domain analysis with a 200-nm reference pinhole.
Figure 7C:
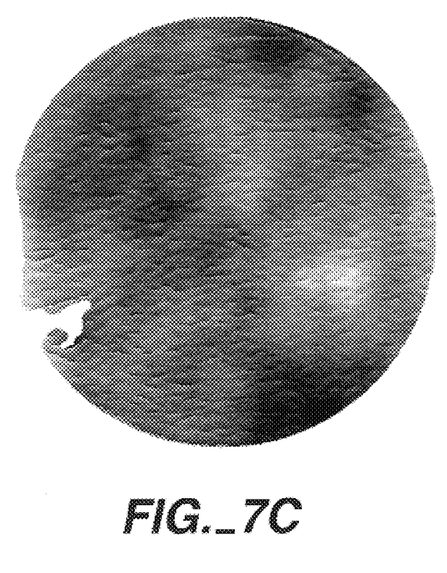
FIG. 7(c) shows the wavefront obtained using a standard PS/PDI mask and conventional time-domain analysis with a 100-nm reference pinhole. (The scattered-reference-light noise is causing obvious phase-retrieval errors)
Figure 7D:
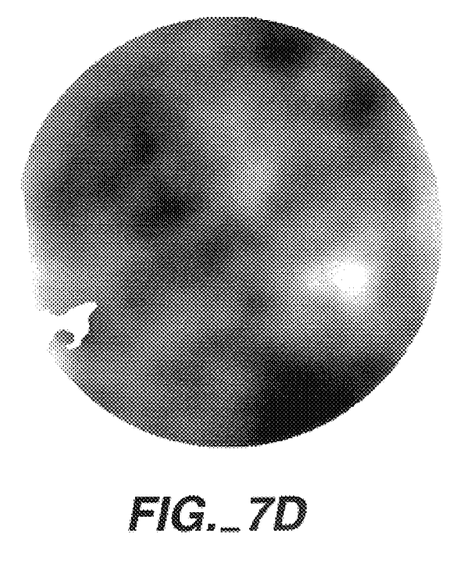
FIG. 7(d) shows the wavefront obtained using a standard PS/PDI mask and dual-domain analysis with a 100-nm reference pinhole.

FIGS. 7(a) and 7(d) demonstrate the effectiveness of dual-domain processing technique in the standard PS/PDI mask configuration and shows that the technique becomes more important as the reference pinhole size decreases. FIG. 7(a) shows the standard temporal-processing results with a 200-nm reference pinhole. Again, the effect of baseband-noise is evident. The noise, however, is not strong enough to cause the phase retrieval to fail. Going to a smaller (100-nm) reference pinhole (FIG. 7(c)), it is apparent that the reduced SNR causes serious phase-retrieval problems. Reprocessing the same phase-shifting data using the dual-domain method adapted to the standard PS/PDI-mask configuration yields the results in FIGS. 7(b) and 7(d) for the 200-nm and 100-nm reference-pinhole cases, respectively. The rms of the difference wavefronts when comparing the dual-domain method to the conventional temporal-domain method is 0.38 nm (0.03 waves) and 1.15 nm (0.09 waves), for the 200-nm and 100-nm reference-pinhole cases respectively.

It is noted that although the wavefronts in FIGS. 6(a) and 7(c) show a considerable amount of noise, low-order Zernike polynomial fitting with high accuracy can still be performed. For example, the mean absolute-valued difference between the first 36 Zernike coefficients determined from FIGS. 7(c) and 7(d) respectively is only 0.05 nm (0.004 waves). Furthermore, much of this error occurs above Zernike 14 [the mean differences including only 7 or 14 terms in the Zernike series, respectively, is 0.01 nm (0.0007 waves) and 0.03 nm (0.002 waves)]. The primary benefits of the dual-domain-analysis method are the extension of the useful spatial frequency range of the PS/PDI measurement in the presence of scatter and the significant simplification of the required phase unwrapping procedures owing to the removal of spurious high-frequency noise-induced features in the wavefront.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. A method of generating an interference pattern with a point diffraction interferometer that comprises the steps of:
   (a) directing a source of radiation toward a test optic provided in a test optic region of the point diffraction interferometer, the test optic having an image plane located downstream from the test optic;
   (b) dividing the source radiation into at least a reference beam and a test beam directed at different angles with respect to one another such that the reference beam impinges at a first location on the image plane and the test beam impinges at a second location, laterally separated from the first location, on the image plane;
   (c) phase-shifting at least one of the reference beam and the test beam;
   (d) passing the reference beam through a reference pinhole on a mask that is positioned at the image plane of the test optic to produce a reference wave and passing the test beam through a window on the mask (the test-beam window) to produce a test wave;
   (e) recording a set of interference patterns (interferograms), with relative phase shifts between each element of the set, wherein the interferograms are produced by combining the reference wave and the test wave while phase shifting either the test wave or reference wave; and (f) recovering a test-beam wavefront by processing the recorded interferograms in both the temporal and spatial domains.

2. The method of claim 1 wherein the separation between the center of the test-beam window and the center of the reference pinhole is sufficiently large relative to the full width of the test-beam window to achieve full separation of the first and zero order components of the recorded interferograms in the spatial-frequency domain.

3. The method of claim 2 wherein the separation between the center of the test-beam window and the center of the reference pinhole is at least about 1.5 times the lateral width of the test-beam window.

4. The method of claim 1 wherein the test-beam window is a rectangular-shaped opening with a width of between 1 $\mu$m and 100 $\mu$m and a length of between 1 $\mu$m and 400 $\mu$m and the separation between the center of the test-beam window and the center of the reference pinhole is between 1.5 $\mu$m and 150 $\mu$m.

5. The method of claim 4 wherein the reference pinhole has a diameter of about 5 nm to 2000 nm.

6. The method of claim 1 wherein the beam divider is a diffraction grating.

7. The method of claim 6 wherein the diffraction grating is positioned between the source of the electromagnetic radiation and the optical element.

8. The method of claim 1 wherein the recording device is a charged-coupled device.

9. The method of claim 1 wherein step (f) comprises (i) bandpass spatial-filtering individual interferograms irradiance frames comprising a phase-shifting series, and (ii) using time-domain-based techniques to recover the test-beam wavefront from the resulting filtered phase-shifting series.

10. The method of claim 9 wherein the separation between the center of the test-beam window and the center of the reference pinhole is sufficiently large relative to the full width of the test-beam window to achieve full separation of the first and zero order components of the recorded interferograms in the spatial-frequency domain.

11. The method of claim 10 wherein the separation between the center of the test-beam window and the center of the reference pinhole is at least about 1.5 times the lateral width of the test beam window.

12. The method of claim 9 wherein the test-beam window is a rectangular-shaped opening with a width of between 1 $\mu$m and 100 $\mu$m and a length of between 1 $\mu$m and 400 $\mu$m and the separation between the center of the test-beam window and the center of the reference pinhole is between 1.5 $\mu$m and 150 $\mu$m.

13. The method of claim 9 wherein the bandpass filter, as defined in the spatial-frequency domain, is (i) substantially equal to the test-beam window size as defined in the spatial-frequency domain and (ii) is centered on the positive- and/or negative-first orders of the recorded interferograms.

14. The method of claim 1 wherein step (f) comprises (i) using time-domain-based techniques to recover the complex amplitude of the test beam from the phase-shifting series, and (ii) bandpass spatial-filtering the resulting complex amplitude to extract the test-beam wavefront.

15. The method of claim 14 wherein the separation between the center of the test-beam window and the center of the reference pinhole is sufficiently large relative to the full width of the test-beam window to achieve full separation of the first and zero order components of the recorded interferograms in the spatial-frequency domain.

16. The method of claim 15 wherein the separation between the center of the test-beam window and the center of the reference pinhole is at least about 1.5 times the lateral width of the test beam window.

17. The method of claim 14 wherein the test-beam window is a rectangular-shaped opening with a width of between 1 $\mu$m and 100 $\mu$m and a length of between 1 $\mu$m and 400 $\mu$m and the separation between the center of the test-beam window and the center of the reference pinhole is between 1.5 $\mu$m and 150 $\mu$m.

18. The method of claim 14 wherein the bandpass filter, as defined in the spatial-frequency domain, is (i) essentially equal to the test-beam window size as defined in the spatial-frequency domain and (ii) is centered on the positive- and/or negative-first orders of the recorded interferograms.

19. The method of claim 1 wherein step (f) comprises embedding a bandpass spatial-filtering process into a time-domain technique algorithm, thereby, simultaneously processing the data in both the temporal and spatial domains.

20. The method of claim 19 wherein the separation between the center of the test-beam window and the center of the reference pinhole is sufficiently large relative to the full width of the test-beam window to achieve full separation of the first and zero order components of the recorded interferograms in the spatial-frequency domain.

21. The method of claim 20 wherein the separation between the center of the test-beam window and the center of the reference pinhole is at least about 1.5 times the lateral width of the test-beam window.

22. The method of claim 19 wherein the test-beam window is a rectangular-shaped opening with a width of between 1 $\mu$m and 100 $\mu$m and a length of between 1 $\mu$m and 400 $\mu$m and the separation between the center of the test-beam window and the center of the reference pinhole is between 1.5 $\mu$m and 150 $\mu$m.

23. The method of claim 19 wherein the bandpass filter, as defined in the spatial-frequency domain, is (i) essentially equal to the test-beam window size as defined in the spatial-frequency domain and (ii) is centered on the positive- and/or negative-first orders of the recorded interferograms.

24. A phase-shifting point diffraction interferometer system that defines an optical path, said system comprising:

(a) a source of electromagnetic energy in the optical path;

(b) a beam divider in the optical path for dividing electromagnetic radiation from the source into a reference beam and a test beam;

(c) an optical system under test that focuses the reference and test beams to its image plane;

(d) a mask that is positioned in the image plane of an optical element under test wherein the reference wave passes through a reference pinhole on the mask and the test beam through a window on the mask (the test-beam window);

(e) a phase-shifting mechanism for adjusting the phase of at least one of the reference beam or the test beam;

(f) a detector located downstream from the mask for recording a set of interference patterns (interferograms), with relative phase shifts between each element of the set, wherein the interference patterns are produced by combining the reference wave and the test wave while phase shifting either the test wave or reference wave; and (g) means for recovering a test-beam wavefront by processing the recorded interferograms in both the temporal and spatial domains.

25. The system of claim 24 wherein the separation between the center of the test-beam window and the center of the reference pinhole is sufficiently large relative to the full width of the test-beam window to achieve full separation of the first and zero order components of the recorded interferograms in the spatial-frequency domain.

26. The system of claim 25 wherein the separation between the center of the test-beam window and the center of the reference pinhole is at least about 1.5 times the lateral width of the test beam window.

27. The system of claim 24 wherein the test-beam window is a rectangular-shaped opening with a width of between 1 $\mu$m and 100 $\mu$m and a length of between 1 $\mu$m and 400 $\mu$m and the separation between the center of the test-beam window and the center of the reference pinhole is between 1.5 $\mu$m and 150 $\mu$m.

28. The system of claim 27 wherein the reference pinhole has a diameter of about 5 nm to 2000 nm.

29. The system of claim 24 wherein the spatial-domain processing component of step (g) comprises the means for implementing a bandpass filter, as defined in the spatial-frequency domain, that is (i) essentially equal to the test-beam window size as defined in the spatial-frequency domain and (ii) is centered on the positive- and/or negative-first orders of the recorded interferograms.

30. The system of claim 24 wherein the beam divider is a diffraction grating.

31. The system of claim 30 wherein the diffraction grating is positioned between the source of the electromagnetic radiation and the optical element.

32. The system of claim 24 wherein the recording device is a charged-coupled device.

33. The system of claim 24 wherein step (g) comprises means for bandpass spatial-filtering the individual interferogram irradiance frames comprising the phase-shifting series and means for time-domain-based analysis for recovering the test-beam wavefront from the resulting filtered phase-shifting series.

34. The system of claim 24 wherein step (g) comprises time-domain-based means for recovering the complex amplitude of the test beam from the phase-shifting series, and means for bandpass spatial-filtering the resulting complex amplitude to extract the test-beam wavefront.

35. The system of claim 24 wherein step (g) comprises embedding the bandpass spatial-filtering process into a conventional time-domain technique algorithm, thereby, simultaneously processing the data in both the temporal and spatial domains.

* * * * *